United States Patent [19]

Gnadinger

[11] Patent Number: 5,119,154
[45] Date of Patent: Jun. 2, 1992

[54] FERROELECTRIC CAPACITOR AND METHOD FOR FORMING LOCAL INTERCONNECT

[75] Inventor: Alfred P. Gnadinger, Colorado Springs, Colo.

[73] Assignee: Micron Technology, Inc., Boise, Id.

[21] Appl. No.: 624,882

[22] Filed: Dec. 3, 1990

[51] Int. Cl.⁵ .................. H01L 29/68; H01L 27/02; H01L 23/48
[52] U.S. Cl. ............................ 357/23.6; 357/51; 357/71
[58] Field of Search ............... 357/51, 23.6, 23.5

[56] References Cited

U.S. PATENT DOCUMENTS

| | | | |
|---|---|---|---|
| 4,149,302 | 4/1979 | Cook | 29/25.42 |
| 4,536,785 | 8/1985 | Gibbons | 357/54 |
| 4,707,897 | 11/1987 | Rohrer et al. | 29/25.42 |
| 4,713,157 | 12/1987 | McMillan et al. | 204/192.11 |
| 4,809,225 | 2/1989 | Dimmler et al. | 365/145 |
| 4,853,893 | 8/1989 | Eaton et al. | 365/145 |
| 4,864,464 | 9/1989 | Gonzalez | 361/311 |
| 4,873,664 | 10/1989 | Eaton | 365/145 |
| 4,888,630 | 12/1989 | Paterson | 357/23.5 |
| 4,888,733 | 12/1989 | Mobley | 365/145 |
| 4,893,272 | 1/1990 | Eaton et al. | 365/145 |
| 4,910,708 | 3/1990 | Eaton et al. | 365/145 |
| 4,914,627 | 4/1990 | Eaton et al. | 365/145 |
| 4,974,204 | 11/1990 | Miller | 365/145 |

OTHER PUBLICATIONS

Handy et al., "Dielectric Based Antifuse For Logic and Memory ICs" IEDM 88, pp. 786-789.

Primary Examiner—Rolf Hille
Assistant Examiner—Robert P. Limanek
Attorney, Agent, or Firm—Arnold, White & Durkee

[57] ABSTRACT

Problems arise when connecting the bottom plate of a ferroelectric capacitor to the source of its associated access transistor during the fabrication of an ultra large scale integrated memory circuit. The temperature and ambient of certain steps of the fabrication process adversely affects ohmic properties of the connection. To overcome these problems, an insulative layer is formed between the bottom plate of a ferroelectric capacitor and its associated transistor. The insulative layer separates the source from the bottom electrode, and subsequent high temperature swings during the remainder of the fabrication process do not produce any direct connection between the source and the bottom plate. After the memory circuits have been fabricated on the semiconductor wafer, a voltage is applied across the ferroelectric capacitor and the insulative layer, preferably during a wafer probe. The magnitude of the applied voltage is selected to breakdown the insulative layer, but does not damage the ferroelectric layer. As a result, a good ohmic contact is produced between the bottom plate and the source of its associated transistor.

44 Claims, 4 Drawing Sheets

FERROELECTRIC CAPACITOR AND METHOD FOR FORMING LOCAL INTERCONNECT

BACKGROUND OF THE INVENTION

1. Technical Field

This invention relates generally to semiconductor memories, such as random access memories, and, more particularly, to a ferroelectric capacitor fabricated on a semiconductor wafer and a method for making same.

2. Background of the Related Art

The use of semiconductor memories has grown dramatically since the 1970's. An ideal semiconductor memory would include desirable features such as: low cost per memory cell, high cell density, short access time, random access read and write cycles, low power consumption, nonvolatility, reliable operation over a wide temperature range, and a high degree of radiation hardness. While many types of semiconductor memories exhibit superior characteristics in one or more of these areas, no semiconductor memory is superior in every area.

For instance, read only memories (ROMs) are nonvolatile since they retain data even when they are not being powered. However, ROMs are typically preprogrammed and new data cannot be written into them. Programmable ROMs (PROMs) may be programmed by users, but they cannot be erased. Some types of ROMs can be programmed and erased with limited success. For instance, erasable PROMs (EPROMs) may be programmed electronically, but they must be exposed to ultraviolet light to erase the memory cells. Unfortunately, the exposure to the ultraviolet light erases all of the memory cells. The memory cells of an electrically erasable PROM (EEPROM) may be read and written electronically. Unfortunately, these memories are expensive, display a limited read and write endurance, and have relatively slow write access times.

Many random access memories (RAMs) are currently available. However, RAMs are volatile, and, thus, depend on external power to maintain the information stored in the memory. Dynamic random access memories (DRAMs), for instance, store information in the form of electrical charges on capacitors. Since each memory cell requires only one transistor and only one capacitor, many memory cells may be fabricated in a relatively small chip area. Static random access memories (SRAMs), on the other hand, utilize a transistor latch having at least two transistors in order to retain information in each memory cell. While SRAMs require little power, they consume a large amount of chip area relative to DRAMs.

Although they are volatile, random access memories display many of the previously listed preferred features such as low cost, high density, short access times, and random access read and write cycles. Therefore, computer designers prefer to store as much usable information as possible in RAMs, as opposed to other types of semiconductor memories or disk-type storage devices. As computers have become faster and more complex, the demand for high density RAMs has dramatically increased. Since DRAMs inherently require the smallest cell size, many memory manufacturers have turned their efforts toward packing as many DRAM cells as possible onto a chip.

Conventional DRAMs use silicon dioxide capacitors as storage capacitors. However, the limited charge density of the silicon dioxide capacitors prohibits further size reductions. Therefore, complex, three-dimensional processes have been used to maintain the size of the silicon dioxide capacitors while conserving chip area. For instance, a three-dimensional capacitor is formed by folding the capacitor into a trench or by stacking the capacitors to achieve adequate charge storage within an acceptable cell size. Since fabricating three-dimensional capacitors is much more expensive than fabricating planar capacitors, the resulting DRAMs are more expensive.

In an effort to overcome these deficiencies, designers have replaced the silicon dioxide capacitors of a conventional DRAM with ferroelectric thin-film capacitors. See H. Bogert, *Research Newsletter*, Dataquest Inc. (1988). Ferroelectric capacitors display an effective dielectric constant of about 1000 to 1500, as compared to a relatively low dielectric constant of about 4 to 7 for silicon dioxide capacitors. Assuming equal thickness of dielectric layers, the result of this increase in the dielectric constant is that the capacitance of the ferroelectric capacitor is approximately 250 times that of a silicon dioxide capacitor. However, typically the thickness of a ferroelectric dielectric layer is approximately 100-300 nanometers, and the thickness of a silicon dioxide dielectric layer is approximately 10-30 nanometers. Therefore, the capacitance of a typical ferroelectric capacitor is approximately 25-30 times that of a typical silicon dioxide capacitor. As a result, much smaller ferroelectric capacitors may be used in place of the silicon dioxide capacitors. The smaller ferroelectric capacitors can be fabricated using a planar process instead of the three-dimensional process used to manufacture high density silicon dioxide capacitors.

In addition to its ability to store a sufficient charge in a smaller area, a ferroelectric capacitor permanently retains charge after application of a voltage. The permanent charge originates from a net ionic displacement within the individual cells of the ferroelectric material. Typically, a ferroelectric cell takes the form of a crystal where atoms within the crystal change position in an electric field and retain this shift even after the electric field is removed. Since electronic circuits can read and write these crystals into one of two permanent states and then sense these states, ferroelectric capacitors are suitable for binary number storage where one crystal state represents a binary one, and the other crystal state represents a binary zero.

Many ferroelectric materials exhibit the same atomic structure as a regular perovskite crystal. A unit cell of a perovskite crystal has a general chemical formula of $ABO_3$, where A is a large cation and B is a small cation. A perovskite crystal has a central metallic ion that is displaced into one of two positions along the axis of an applied electric field to create an electric dipole. The central ion remains polarized until an electric field is again applied to reverse it.

In a thin-film ferroelectric capacitor, the individual crystals or cells interact to produce domains within the material in response to a voltage being applied across the material. The voltage produces an electric field across the ferroelectric material and causes compensating charge to move through the material to the plates of the capacitor. After the voltage is removed, the majority of the domains remain polarized in the direction of the applied electric field, and compensating charge remains on the plates of the ferroelectric capacitor to maintain the polarization.

If a voltage is applied to the ferroelectric capacitor in the same direction as the previously applied voltage, some of the minority of domains, i.e., the remanent domains, polarize in the same direction as the majority of domains. Thus, only a small amount of compensating charge flows onto the capacitor plates. However, if the field is applied in the opposite direction, many domains switch their polarization. Therefore, a greater amount of charge flows onto the capacitor. For a more detailed discussion of ferroelectrics, see L. Cross and K. Hardtl, *Encyclopedia of Semiconductor Technology*, pp. 234–64, (Grayson, Martin ed. 1985).

To form a ferroelectric capacitor as part of an integrated circuit semiconductor chip, a film of ferroelectric material, usually less than a micrometer in thickness, is sandwiched between two metal electrodes. When properly deposited and annealed, the ferroelectric material exhibits the same atomic structure as the previously discussed perovskite crystal. Platinum is typically used for the electrodes, but the choice of the metal depends on the electrical qualities that best compliment the selected ferroelectric material. For instance, the structure of the metal must promote the formation of the proper ferroelectric phase.

Deposition of the ferroelectrics must be precisely controlled or the resulting crystal structure will not be uniform. Molecular-beam epitaxy and radio frequency sputtering have been used to apply the ferroelectric material with some success. However, difficulty arises in forming the interconnection between the bottom plate of the ferroelectric capacitor and the diffused region, e.g., the source or the drain, of the access transistor. Once the appropriate material of the capacitor plates is selected, the bottom plate is formed by depositing the metal onto the diffused region of the silicon wafer. The temperature is then raised briefly to about 650° C. to ensure that the metal adheres well to the silicon.

Next, the ferroelectric material is deposited onto the bottom plate. Typically, the ferroelectric material is deposited at room temperature. Then, the ferroelectric material is annealed in the presence of oxygen by raising the temperature to between 500° and 700° C. At this temperature, the material is in a paraelectric phase, but, as the material cools, it enters the perovskite (ferroelectric) phase and becomes randomly polarized. The presence of oxygen during the anneal is important otherwise the proper ferroelectric phase will not form due to oxygen deficiency in the layer.

However, if the bottom plate is made from Platinum or a standard barrier metal, such as TiN, TiW or Ru$_2$O$_3$, it will be adversely affected, particularly in the presence of oxygen, by the high temperatures required to form the perovskite phase in the ferroelectric material. During deposition of the ferroelectric material, the metal of the bottom plate interdiffuses with the diffused region of silicon so that a good ohmic contact, e.g., less than about 100 ohms, cannot be achieved without destroying the integrity of the structure and the switching properties of the ferroelectric capacitor.

The present invention is directed to overcoming or at least minimizing one or more of the problems mentioned above.

SUMMARY OF THE INVENTION

In accordance with one aspect of the present invention, there is provided a semiconductor memory cell that includes an access transistor. The drain of the access transistor is connected to an associated bit line, and the gate of the access transistor is connected to an associated word line. The top plate of a ferroelectric storage capacitor is connected to a plate line. An insulative layer is disposed between the source of the access transistor and the bottom plate of the capacitor so that the source is separated from the bottom plate.

Preferably, the insulative layer has a first predetermined breakdown voltage, and the layer of ferroelectric material has a second preselected breakdown voltage which is greater than the first preselected breakdown voltage. Typically, this corresponds to the insulative layer being thinner than the ferroelectric layer. Therefore, application of a voltage having a magnitude greater than the first preselected breakdown voltage and less than the second preselected breakdown voltage between the source and the top plate of the capacitor breaks down the layer of insulative material and substantially connects the bottom plate to the source of the access transistor.

In accordance with another aspect of the present invention, there is provided a method for fabricating a semiconductor memory cell. First, an access transistor having a source, a drain, and a gate is formed. Second, a layer of insulative material is applied onto the source. Third, a first conductive layer is formed over the insulative layer. Fourth, a layer of ferroelectric material is applied onto the first conductive layer. Fifth, a second conductive layer is formed over the ferroelectric layer.

To connect the first conductive layer, i.e., the bottom plate of the ferroelectric capacitor, to the source of the transistor a voltage is delivered between the source and the second conductive layer, i.e., the top plate of the ferroelectric capacitor. The voltage has a magnitude sufficient to breakdown the layer of insulative material and insufficient to breakdown the layer of ferroelectric material.

BRIEF DESCRIPTION OF THE DRAWINGS

The foregoing and other advantages of the invention will become apparent upon reading the following detailed description and upon reference to the drawings in which.

Figure 2:
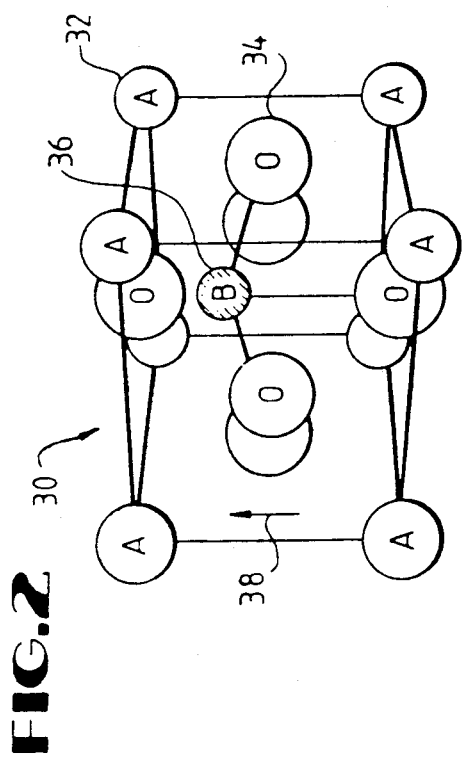
FIG. 2 illustrates a unit cell of a preferred ferroelectric material in the form of a perovskite crystal in a state that represents a first binary state.

While the invention is susceptible to various modifications and alternative forms. specific embodiments have been shown by way of example in the drawings and will be described in detail herein. However, it should be understood that the invention is not intended to be limited to the particular forms disclosed. Rather, the invention is to cover all modifications. equivalents. and alternatives falling within the spirit and scope of the invention as defined by the appended claims.

DESCRIPTION OF THE PREFERRED EMBODIMENTS

Figure 1:
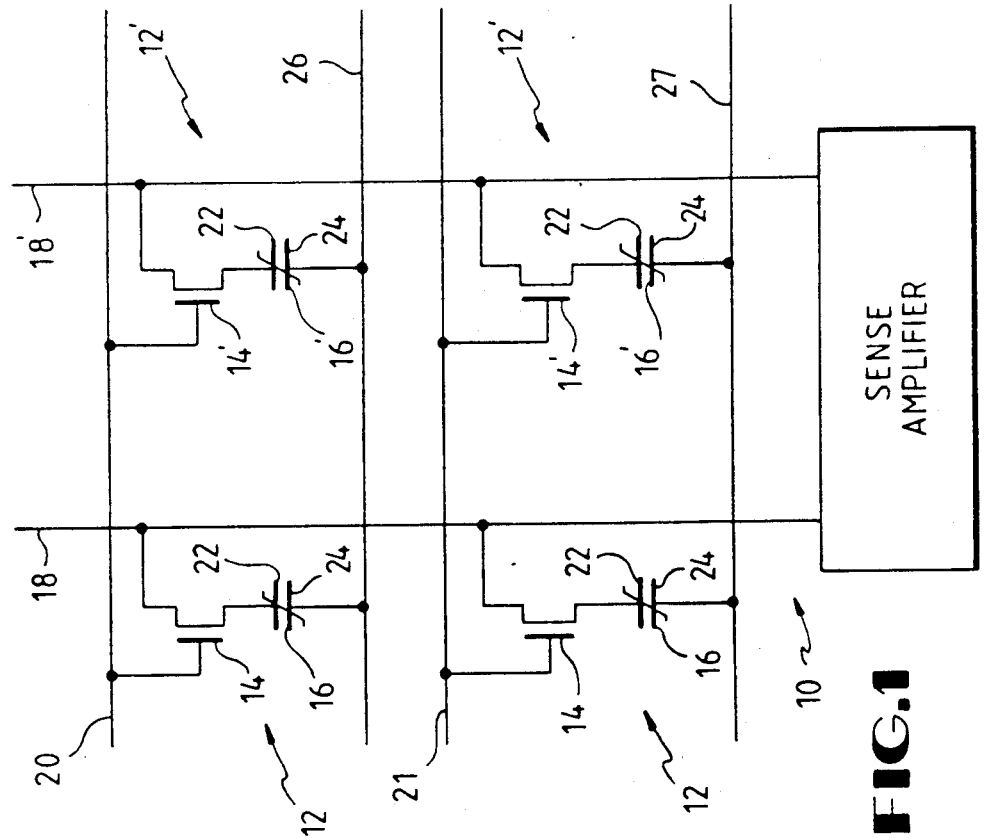
FIG. 1 is a schematic illustration of a portion of a dynamic random access memory using ferroelectric capacitors.

Turning now to the drawings and referring initially to FIG. 1, a ferroelectric random access memory (FERRAM) 10, which is a semiconductor dynamic random access memory using ferroelectric capacitors as storage capacitors, is schematically illustrated. While a memory using ferroelectric capacitors may take a number of forms, the structure and operation of the FERRAM 10 as shown in FIG. 1 will be briefly described so that the reader may attain a better overall understanding of the present invention.

Each memory cell 12 or 12' of the FERRAM 10 includes an access transistor 14 or 14' and a ferroelectric storage capacitor 16 or 16'. Preferably, each of the access transistors 14 and 14' are metal-oxide semiconductor field effect transistors, more commonly referred to as MOSFETs. As illustrated, the drain of each of the transistors 14 and 14' is connected to a respective bit line 18 or 18'. The gate of each transistor 14 and 14' is connected to a respective word line 20 or 21. The source of each transistor 14 or 14' is connected to the bottom electrode or plate 22 of its respective ferroelectric capacitor 16 or 16'. The top electrode or plate 24 of each ferroelectric capacitor 16 or 16' is connected to its respective plate line 26 or 27. Preferably, a sense amplifier 28 is connected between each pair of bit lines 18 and 18' in the memory array of the FERRAM 10.

To write to the memory cells 12 and 12' that are connected to the word line 20, for instance, a decoder (not shown) selectively produces a logical "1" voltage signal on the word line 20. The high voltage on the word line 20 turns on the access transistors 14 and 14' that are connected to the word line 20. Once turned on, the access transistors 14 and 14' connect the associated ferroelectric storage capacitors 16 and 16' to their respective bit lines 18 and 18'. The sense amplifier 28 drives one bit line 18 to a logical "1" and the other bit line 18' to a logical "0." The plate line 26 is then pulsed to a logical "1." With the plate line 26 at a high voltage and the bit line 18' at a low voltage, the direction of the resulting electric field across the ferroelectric capacitor 16' writes a logical "0" into that capacitor. When the plate line 26 falls back to a logical "0", the high voltage on the bit line 18 produces an electric field in the opposite direction across the ferroelectric capacitor 16, and, thus, writes a logical "1" onto that capacitor.

To read the binary information stored on one of the capacitors 16 or 16', the plate line 26 is again pulsed to a logical "1," the bit lines 18 and 18' are allowed to float, and the sense amplifier 28 is turned off. Since the information stored in the ferroelectric capacitor 16 is opposite the information stored in the other ferroelectric capacitor 16', a voltage differential is produced between the bit lines 18 and 18'. When the sense amplifier 28 turns on, it drives the high going bit line 18 to the positive voltage, e.g., $V_{dd}$, and the other bit line 18' to ground. Not only does this operation sense the information stored in one of these selected memory cells 12 and 12', it also restores both ferroelectric capacitors 16 and 16' to their original states (if the plate line 26 is pulsed again to a logical "0").

Figure 3:
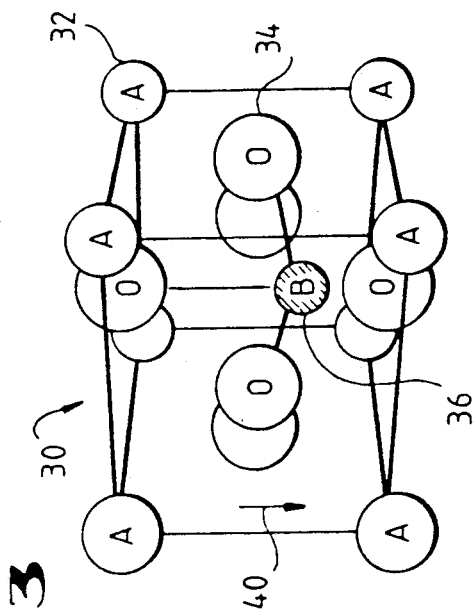
FIG. 3 illustrates the unit cell of FIG. 2 in a state that represents a second binary state.

Referring additionally to FIGS. 2 and 3, a unit cell 30 of the ferroelectric material that comprises the dielectric of the ferroelectric capacitors 16 and 16' is illustrated. Preferably, a ferroelectric material that exhibits a perovskite crystalline structure (chemical formula $ABO_3$) is used, such as lead zircronate titanate (PZT), lanthanum-doped PZT (PLZT), or lithium niobate ($LiNbO_3$). The A atoms 32 are large cations situated at the corners of the unit cell 30, and the oxygen atoms 34 are situated at the face centers of the unit cell 30. The B atom 36 is a small cation that is located near the center of the unit cell 30 and bonded to the six oxygen atoms 34. In PZT, the A atoms 32 are lead and the B atom 36 is titanium or zirconium.

The B atom 36 may be displaced into one of two positions along the axis of an applied electric field to create an electric dipole. This polarization is relatively permanent until another electric field reverses it. For example, if an electric field is applied to the unit cell 30 in the direction of arrow 38, the B atom 36 is displaced upwardly, as illustrated in FIG. 2. Alternatively, when an electric field is applied across the unit cell 30 in the direction of the arrow 40, the B atom 36 is displaced downwardly, as illustrated in FIG. 3.

Figure 4:
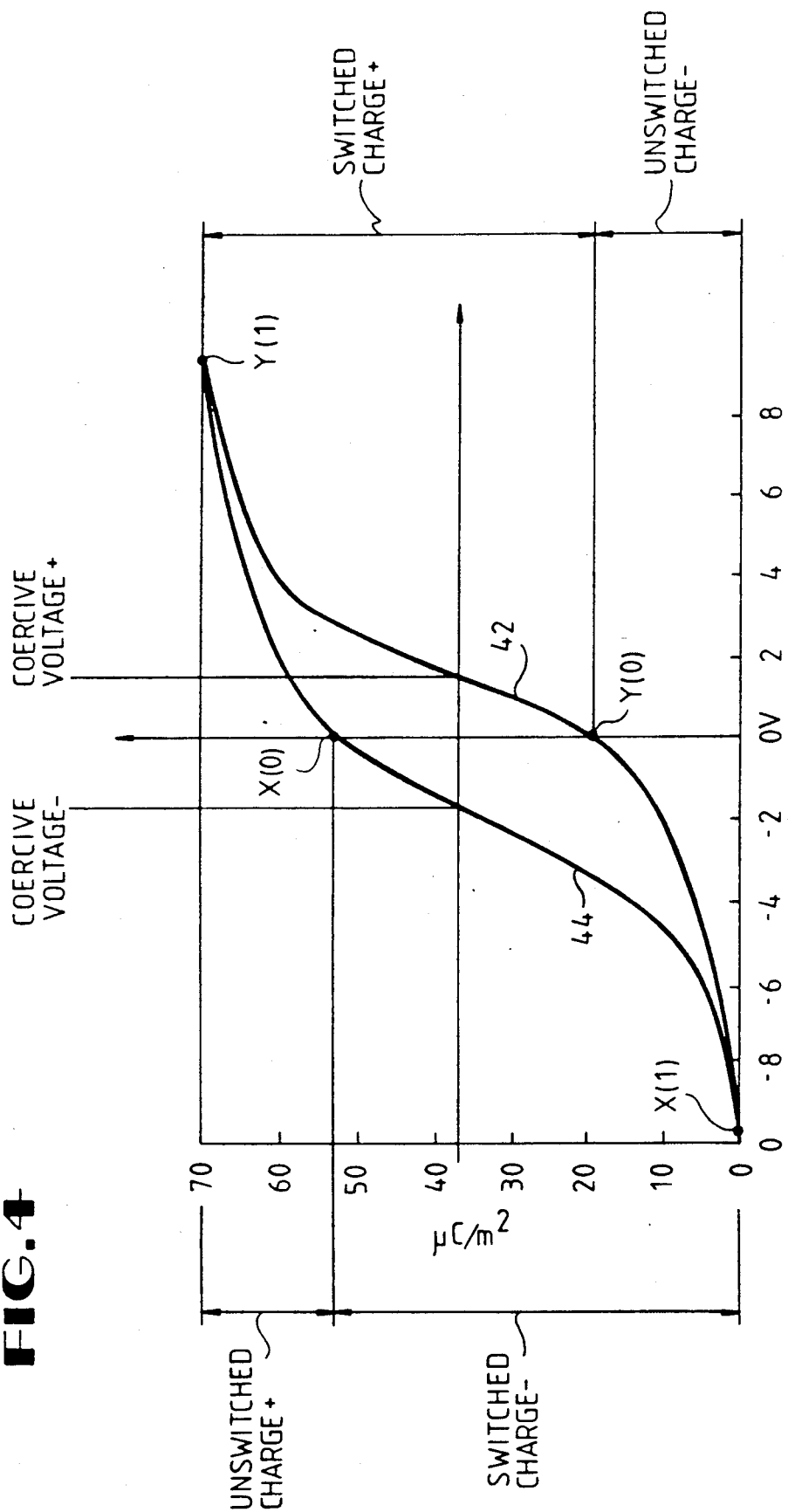
FIG. 4 is a graph illustrating a hysteresis curve of a ferroelectric capacitor.

A ferroelectric thin-film memory capacitor 16 and 16' exhibits a characteristic hysteresis curve which describes the amount of charge the device stores as a function of the applied voltage. A typical hysteresis curve is illustrated in FIG. 4 as a function of charge density versus applied voltage. The coercive voltages Vc and −Vc represent the digital switching threshold of the capacitor 16 and 16'. For memory applications, it is desirable that the two coercive voltage points Vc and −Vc be symmetrical about zero volts between −2.5 volts and +2.5 volts, so that the memory can operate from standard semiconductor memory power supply voltages, which are typically −5 volts to +5 volts. Typically, the switched charge of a ferroelectric capacitor 16 and 16' is greater than 20 microcoulombs per square centimeter, which is an order of magnitude higher than the 1.7 microcoulombs per square centimeter that is typical of current DRAM capacitors. For a PZT thin film capacitor, the typical switching threshold is about 1 to 2 volts, so it is compatible with a 5 volt power supply. Nonvolatile operation results from stable polarization states X and Y that exist at the top and bottom of the loops, respectively.

The permanent charge storage of a ferroelectric capacitor 16 results from a net ionic displacement of the unit cells in the ferroelectric capacitor material that results from the application of voltage across the ferroelectric capacitor 16 or 16'. When voltage is applied across a ferroelectric capacitor 16 or 16', the individual unit cells 30 constructively interact to produce polarized domains within the material. After the voltage is removed, the majority of the domains remain polarized in the direction of the applied electric field, as previously described in regard to FIGS. 2 and 3. Therefore, compensating charge remains on the plates of the capacitor 16 to maintain this polarization.

When the polarization of a ferroelectric capacitor 16 switches, the switched charge represents the majority of the unit cells 30 that switch in response to an applied voltage, and the unswitched charge represents the remaining unit cells 30 that do not switch in response to the applied voltage. For example, if the capacitor 16 is in the stable polarization state Y(0) and a positive voltage greater than the coercive voltage is impressed across the capacitor 16, then the capacitor conducts current along curve 42 and the charge density increases to point Y(1). When the voltage returns to zero, the charge density decreases slightly along curve 44 to point X(0). If another positive voltage is impressed across the capacitor 16, the charge density changes little since there is little unswitched charge. However, if a negative voltage greater than the negative coercive voltage is impressed across the capacitor 16, current flows through the capacitor 16 and the charge density decreases to point X(1). When the negative voltage returns to zero, the charge density increases slightly along curve 42 to point Y(0).

When the plate line 26 or 27 is pulsed to read the contents of a memory cell 12 or 12', the change in charge on the bit lines 18 and 18' depends on the previous state of polarization of the ferroelectric capacitor 16 or 16'. As previously described with respect to FIG. 1, to read information stored in a ferroelectric capacitor 16, a positive voltage pulse having a magnitude greater than the coercive voltage is applied. If little current flows through the capacitor 16 then the capacitor is in state X(0), which may correspond to a binary one. On the other hand, if a substantial amount of current flows through the capacitor 16 then the capacitor was in state Y(0), which may correspond to a binary zero. Thus, after even extended periods without power, the ferroelectric capacitors 16 and 16' can be pulsed to determine the last logical state stored in the capacitor 16 or 16'. Therefore, not only do the ferroelectric capacitors 16 and 16' provide increased charge density to allow the use of smaller capacitors in ultra large scale integration memory circuits, but they also provide nonvolatile charge storage.

The surface of a typical integrated circuit memory is a maze of p-type and n-type regions that must be contacted and interconnected. It is important that such contacts and interconnections be ohmic, with minimal resistance and no tendency to rectify signals. During the metallization step in the fabrication process, the various regions of each circuit element are contacted and proper interconnection of the circuit elements is made. Aluminum is commonly used for metallization since it adheres well to silicon and to silicon dioxide if the temperature is raised briefly to about 400° to 450° C. after deposition. However, platinum is the best choice of the bottom electrode for a ferroelectric capacitor, because platinum allows good crystal growth for the PZT ferroelectric material. Unfortunately, platinum forms a Schottky barrier when applied to a silicon semiconductor, and tends to rectify signals passing across the metal-semiconductor junction.

Figure 5:
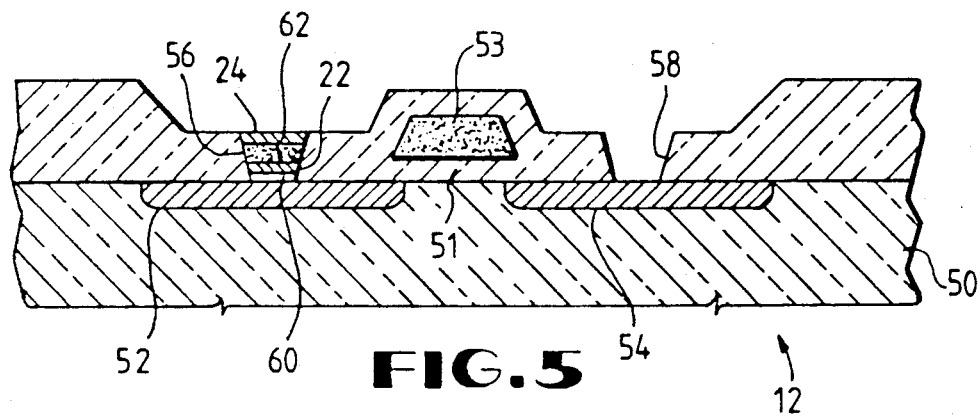
FIG. 5 is a cross-sectional view of a dynamic memory cell having a ferroelectric capacitor separated from its associated transistor by a thin insulating layer.

Referring now to FIG. 5, a cross-sectional view of a memory cell 12 is illustrated. For an n-channel MOSFET, a p-type silicon wafer 50 is used. To fabricate the access transistor 14, an oxide layer 51 is grown on the p-type wafer 50 and polysilicon 53 is deposited thereon. Portions of the oxide 51 and polysilicon 53 are etched away, and the source 52 and the drain 54 of the transistor 14 are formed by diffusing an impurity in column V of the periodic table, such as phosphorus, arsenic or antimony, into the exposed portions of the wafer 50. Silicon dioxide is again deposited onto the wafer 50, and windows for the contact holes 56 and 58 are masked and etched.

To fabricate the ferroelectric capacitor 16 or 16', a layer of an insulative material 60 is deposited in the contact hole 56 on the source 52. Preferably, the insulative layer 60 is either silicon dioxide ($SiO_2$), a nitride layer (SiN), or an amorphous silicon layer. Any appropriate deposition method may be used, such as thermal growth or CVD deposition. Preferably, the thickness of the insulative layer 60 is approximately 100 angstroms (10 nanometers).

A conductive layer, which forms the bottom plate 22, is deposited on top of the insulative layer 60. Preferably, the bottom plate 22 is platinum and deposited by sputtering. The ambient temperature is briefly raised to about 650° C. to insure proper adhesion between the bottom plate 22 and the source 52.

Next, a thin film 62 of the ferroelectric material is deposited or grown on the bottom electrode 22. Preferably, the ferroelectric material is PZT and deposited using sol-gel processing or radio frequency sputtering. Advantageously, the thickness of the ferroelectric film 62 is at least an order of magnitude greater than the thickness of the insulative layer 60. For example, if the thickness of the insulative layer 60 is approximately 100 angstroms, the thickness of the ferroelectric film is approximately 1000 to 2000 angstroms. The ferroelectric film 62 is deposited at room temperature. Then, the ferroelectric film is annealed at a relatively high temperature of approximately 500° to 700° C., and then cooled so that the unit cells form perovskite crystals. However, this high temperature does not cause the bottom plate 22 to interdiffuse with the silicon source 52 because the insulative material 60 is disposed therebetween.

The top plate 24 is then deposited onto the ferroelectric layer 62 in much the same manner as the bottom electrode 22 was deposited onto the insulative layer 60. Again, the ambient temperature is briefly raised to about 650° C. This annealing step insures proper phase formation of the ferroelectric material and proper adhesion between the top plate 24 and the ferroelectric film 62.

Figure 6:
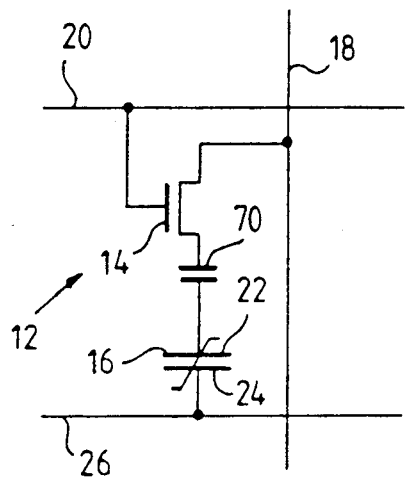
FIG. 6 is a schematic illustration of the memory cell illustrated in FIG. 5.

After processing is completed and before forming the local interconnect between the bottom electrode 22 and the source 52, the structure of the memory cell 12 resembles that described in FIG. 5. FIG. 6 illustrates the equivalent circuit of the memory cell 12 before the local interconnect is formed. The insulative layer 60, which is disposed between the source 52 of the access transistor 14 and the bottom plate 22, electrically appears as a capacitor 70 in series with the ferroelectric capacitor 16. Although the areas of the capacitors 22 and 70 are substantially equal, the thicknesses of the two layers 60 and 62 are approximately 20 to 1: approximately 2,000 angstroms for the ferroelectric layer 62 and approximately 100 angstroms for the insulative layer 60. The dielectric constants are about 250 to 1: approximately 1,000 for the ferroelectric capacitor 16 and approximately 4 for the series capacitor 70. Therefore, the capacitance of the ferroelectric capacitor 16 is approximately twelve times that of the capacitance of the series capacitor 70.

Given the different capacitances, when a voltage is applied across the series combination of the capacitor 70 and the capacitor 16, less than 10% of the voltage will drop across the capacitor 16. To form the interconnect between the bottom plate 22 and the source 52, a predetermined voltage is applied across the capacitor 70 and the ferroelectric capacitor 16. The predetermined voltage should be sufficient to exceed the breakdown voltage of the insulative layer 60 in the capacitor 70 without damaging the ferroelectric layer 62 in the capacitor 16. Preferably, the interconnection is formed during a wafer probe, which is a functional testing of the memory device in wafer form, by applying the predetermined voltage to the bit lines 18 and 18' while the appropriate word lines are at a logical "1." Alternatively, the interconnect may be formed by applying the predetermined voltage to many capacitors by operating the memory in a parallel mode where several bit and word lines are activated at once.

Figure 8:
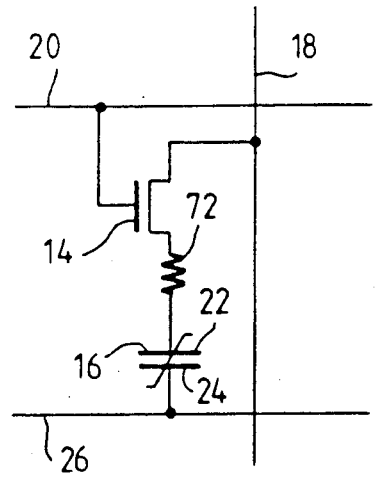
FIG. 8 is a schematic illustration of the memory cell illustrated in FIG. 7.
Figure 7:
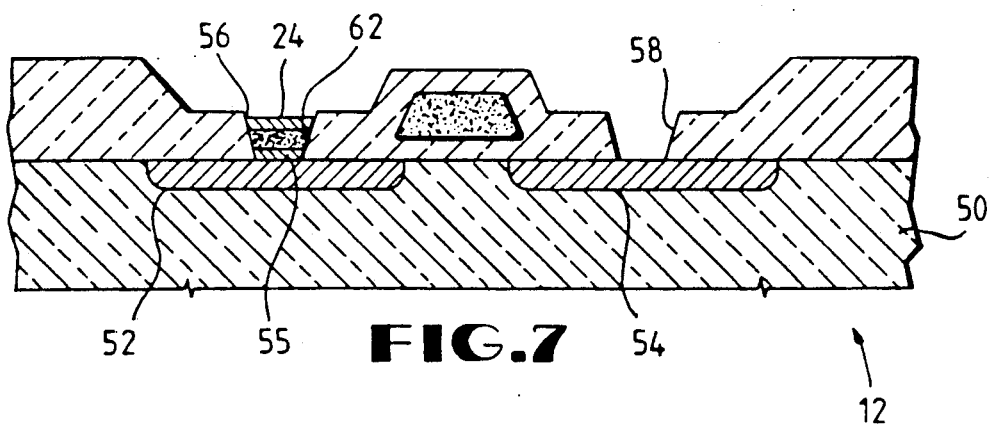
FIG. 7 is a cross-sectional illustration of a dynamic memory cell having a ferroelectric capacitor interconnected with its associated transistor.

FIG. 7 illustrates a cross-sectional view of a memory cell 12 after the local interconnect has been formed between the bottom plate 22 of the ferroelectric capacitor 16 and the source 52 of the access transistor 14. FIG. 8 illustrates an equivalent circuit diagram of a memory cell 12 after the local interconnect has been formed. Since the insulative layer 60 has been effectively destroyed by the application of the predetermined voltage in excess of its breakdown voltage, FIG. 7 shows the bottom plate 22 as being interconnected with the source region 52. The destroyed insulative layer 60 provides an ohmic contact between the bottom plate 22 and the source 52. This small resistance is illustrated in FIG. 8 as a resistor 72 that is connected in series between the source 52 of the access transistor 14 and the bottom plate 22 of the ferroelectric capacitor 16. The value of the resistor 72 is typically only a few ohms, and certainly less than 100 ohms. Specifically, the value of the resistor 22 will not adversely impact the performance of the memory cell 12. Since there are no high temperature steps required after the formation of the local interconnect by the application of the predetermined voltage, the interconnection between the bottom plate 22 and the silicon source 52 will be highly reliable.

Figure 9:
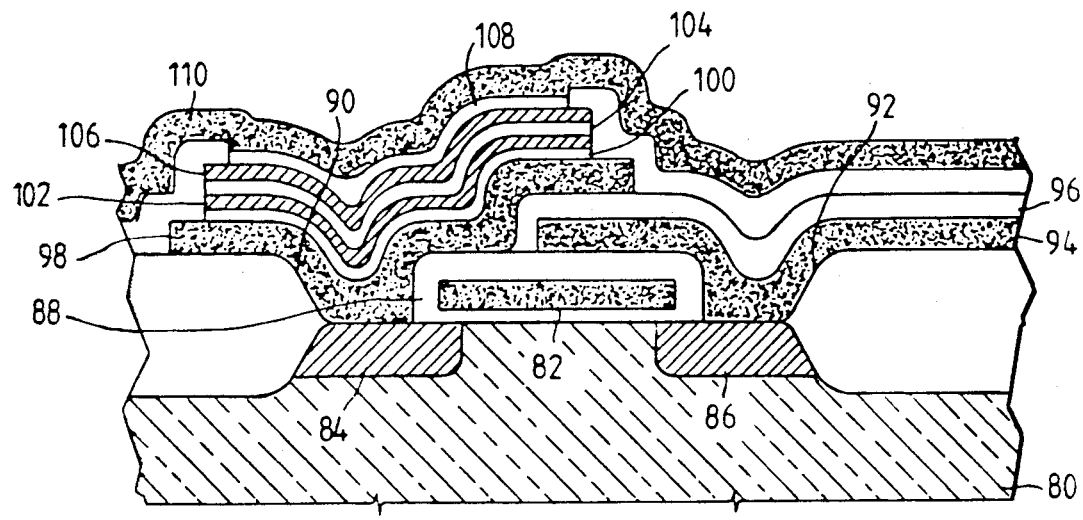
FIG. 9 is an alternate cross-sectional view of a dynamic memory cell having a ferroelectric capacitor separated from its associated transistor by a thin insulating layer.

The previously described method for forming a ferroelectric capacitor can also be utilized where the ferroelectric capacitor is formed directly on a polysilicon line. Referring now to FIG. 9, an alternate cross-sectional view of the memory cell 12 is illustrated. For an n-channel MOSFET, a p-type silicon wafer 80 is used. To fabricate the access transistor 14, an oxide layer is grown on the p-type wafer 80 and polysilicon is deposited thereon. Portions of the oxide and polysilicon are etched away to leave a polysilicon gate 82. The polysilicon gate 82 also functions as the word line 20. The source 84 and the drain 86 of the transistor 14 are formed by diffusing an impurity in column V of the periodic table, such as phosphorus, arsenic or antimony, into the exposed portions of the wafer 80.

Silicon dioxide 88 is again deposited onto the wafer 80, and windows for the contact holes 90 and 92 are masked and etched. A layer of polysilicon 94 is deposited over a portion of the oxide layer 88 and over the contact hole 92. The polysilicon layer 94 forms the bit line 18. A layer of silicon dioxide 96 is deposited over the polysilicon line 94 as an insulative layer. Again, the contact hole 90 is etched, and a layer of polysilicon 98 is deposited over the contact hole 90. The layer of polysilicon 98 will form the connection between the source 84 of the access transistor 14 and the bottom electrode 22 of the storage capacitor 16.

To fabricate the ferroelectric capacitor 16 or 16', a layer of an insulative material 100 is deposited onto the polysilicon layer 98. Preferably, the insulative layer 100 is either silicon dioxide (SiO$_2$), a nitride layer (SiN), or an amorphous silicon layer. Any appropriate deposition method may be used, such as thermal growth or CVD deposition. Preferably, the thickness of the insulative layer 100 is approximately 100 angstroms (10 nanometers).

A conductive layer 102, which forms the bottom plate 22, is deposited on top of the insulative layer 100. Preferably, the bottom plate 22 is platinum and deposited by sputtering. The ambient temperature is briefly raised to about 650° C. to insure proper adhesion between the bottom plate 22 and the insulative layer 100.

Next, a thin film 104 of the ferroelectric material is deposited or grown on the bottom electrode 22. Preferably, the ferroelectric material is PZT and deposited using sol-gel processing or radio frequency sputtering. Advantageously, the thickness of the ferroelectric film 104 is at least an order of magnitude greater than the thickness of the insulative layer 100, as described in reference to FIG. 5. The ferroelectric film 104 is deposited at room temperature. Then, the ferroelectric film 104 is annealed at a relatively high temperature of approximately 500° to 700° C., and then cooled so that the unit cells form perovskite crystals. However, this high temperature does not cause the bottom plate 22 to interdiffuse with the polysilicon layer 98 because the insulative material 100 is disposed therebetween.

A second conductive layer 106, which forms the top plate 24 of the storage capacitor 16, is then deposited onto the ferroelectric layer 104 in much the same manner as the bottom electrode 22 was deposited onto the insulative layer 100. Again, the ambient temperature is briefly raised to about 650° C. This annealing step insures proper phase formation of the ferroelectric material and proper adhesion between the top plate 24 and the ferroelectric layer 104.

Optionally, a second insulative layer 108 may be deposited over the top plate 24. Then, a final layer of polysilicon 110 is deposited over the entire memory cell. The polysilicon layer 110 connects the top plate 24 to the plate line 26.

After processing is completed and before forming the local interconnect between the bottom electrode 22 and the polysilicon layer 98, the equivalent circuit of the memory cell 12 is the same as that illustrated in FIG. 6. The insulative layer 100, which is disposed between the polysilicon layer 98 and the bottom plate 22, electrically appears as a capacitor 70 in series with the ferroelectric capacitor 16. Although the areas of the capacitors 22 and 70 are substantially equal, the thicknesses of the two layers 104 and 100 are approximately 20 to 1; approximately 2,000 angstroms for the ferroelectric layer 104 and approximately 100 angstroms for the insulative layer 100. Therefore, when a predetermined voltage is applied across the capacitor 16, as previously discussed, the insulative layer 100 (and the insulative layer 108, if present) will breakdown. Thus, the bottom plate 22 becomes interconnected with the polysilicon layer 98 which is connected to the source region 84.

Figure 10:
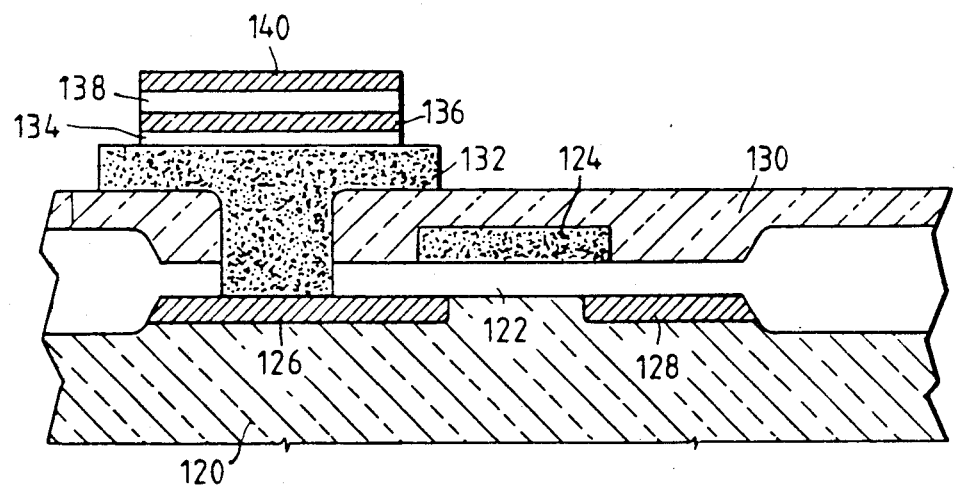
FIG. 10 is another alternate cross-sectional view of a dynamic memory cell having a ferroelectric capacitor separated from its associated transistor by a thin insulating layer.

This method for forming a ferroelectric capacitor can also be utilized where the ferroelectric capacitor is formed as a stacked capacitor in a memory cell 12 having a diffused bit line. Referring now to FIG. 10, another alternate cross-sectional view of the memory cell 12 is illustrated. For an n-channel MOSFET, a p-type silicon wafer 120 is used. To fabricate the access transistor 14, a gate oxide layer 122 is grown on the p-type wafer 120 and polysilicon is deposited thereon. Portions of the oxide an polysilicon are etched away to leave a polysilicon gate 124. The polysilicon gate 124 also functions as the word line 20. The source 126 and the drain 128 of the transistor 14 are formed by diffusing an impurity in column V of the periodic table, such as phosphorus, arsenic or antimony, into the exposed portions of the wafer 120.

In this memory cell configuration, the drain 128 of the transistor 14 functions as the diffused bit line 18. Therefore, an intermediate layer of silicon dioxide 130 is deposited onto the wafer 120, and a single window for the contact hole 130 is masked and etched. Polysilicon 132 is then deposited over the contact hole 130. The polysilicon 132 will form the local interconnect between the source 126 and the bottom plate 22.

Using a series of masking and etching steps, the ferroelectric capacitor 16 is formed. A layer of an insulative material 134 is deposited onto the polysilicon 132. Preferably, the insulative layer 134 is either silicon dioxide ($SiO_2$), a nitride layer (SiN), or an amorphous silicon layer. Any appropriate deposition method may be used, such as thermal growth or CVD deposition. Preferably, the thickness of the insulative layer 134 is approximately 100 angstroms (10 nanometers).

A conductive layer 136, which forms the bottom plate 22, is deposited on top of the insulative layer 134. Preferably, the bottom plate 22 is platinum and deposited by sputtering. The ambient temperature is briefly raised to about 650° C. to insure proper adhesion between the bottom plate 22 and the insulative layer 134.

Next, a thin film 138 of ferroelectric material is deposited or grown on the bottom plate 22. Advantageously, the thickness of the ferroelectric film 138 is at least an order of magnitude greater than the thickness of the insulative layer 134, as described in reference to FIGS. 5 and 9. The ferroelectric film 138 is deposited at room temperature, and, then, annealed at a relatively high temperature of approximately 500° to 700° C. Upon cooling the unit cells of the ferroelectric material form perovskite crystals. However, this high temperature does not cause the bottom plate 22 to interdiffuse with the polysilicon 132 because the insulative material 134 is disposed therebetween.

A second conductive layer 140, which forms the top plate 24 of the storage capacitor 16, is then deposited onto the ferroelectric layer 138 in much the same manner as the first conductive layer 136, which forms the bottom electrode 22, was deposited onto the insulative layer 134. Again, the ambient temperature is briefly raised to about 650° C. This annealing step insures proper phase formation of the ferroelectric material and proper adhesion between the top plate 24 and the ferroelectric layer 138.

After processing is completed and before forming the local interconnect between the bottom electrode 22 and the polysilicon 132, the equivalent circuit of the memory cell 12 is the same as that illustrated in FIG. 6. The insulative layer 134, which is disposed between the polysilicon 132 and the bottom plate 22, electrically appears as a capacitor 70 in series with the ferroelectric capacitor 16. Although the areas of the capacitors 22 and 70 are substantially equal, the thicknesses of the two layers 138 and 134 are approximately 20 to 1: approximately 2,000 angstroms for the ferroelectric layer 138 and approximately 100 angstroms for the insulative layer 134. Therefore, when a predetermined voltage is applied across the capacitor 16, as previously discussed, the insulative layer 134 will breakdown. Thus, the bottom plate 22 becomes interconnected with the polysilicon 132 which is connected to the source region 126.

While the present invention was described with reference to a dynamic random access memory using n-channel field effect transistors, it should be readily apparent that the ultra large scale integration of other types of semiconductor circuits using other types of transistors may benefit by the method for forming a ferroelectric capacitor disclosed herein.

I claim:

1. A semiconductor memory cell, comprising:
   a transistor having at least one region formed in a face of a semiconductor body, said transistor being adapted to be coupled to an associated bit line and an associated word line;
   a storage capacitor having a bottom electrode and a top electrode, said top electrode being separated from said bottom electrode by a layer of ferroelectric material disposed therebetween, and said top electrode being adapted to be coupled to a plate line; and
   an insulative layer disposed between said region and said bottom electrode, said insulative layer initially separating said diffused region from said bottom electrode then forming an ohmic contact between said region and said bottom electrode by breakdown.

2. The memory cell, as set forth in claim 1, wherein said insulative layer has a first predetermined breakdown voltage, and said layer of ferroelectric material has a second preselected breakdown voltage, said second preselected breakdown voltage being greater than said first preselected breakdown voltage.

3. The memory cell, as set forth in claim 1, wherein said insulative layer has a first preselected thickness, and said layer of ferroelectric material has a second preselected thickness, said second preselected thickness being greater than said first preselected thickness.

4. The memory cell, as set forth in claim 3, wherein said first preselected thickness corresponds to a first preselected breakdown voltage and said second preselected thickness corresponds to a second preselected breakdown voltage, said second preselected breakdown voltage being greater than said first preselected breakdown voltage.

5. The memory cell, as set forth in claim 3, wherein said second preselected thickness is in the range of 5 to 50 times thicker than said first preselected thickness.

6. The memory cell, as set forth in claim 5, wherein said first preselected thickness is about 100 angstroms and said second preselected thickness is about 2000 angstroms.

7. The memory cell, as set forth in claim 1, wherein said insulative material has a first dielectric constant, and said ferroelectric material has a second dielectric constant, said second dielectric constant being greater than said first dielectric constant.

8. The memory cell, as set forth in claim 7, wherein said second dielectric constant is at least two orders of magnitude greater than said first dielectric constant.

9. The memory cell, as set forth in claim 8, wherein said first dielectric constant is about 4 and said second dielectric constant is about 1000.

10. The memory cell, as set forth in claim 1, wherein said ferroelectric material is selected from a group consisting of lead zircronate titanate, lanthanum-doped lead zircronate titanate, or lithium niobate.

11. A semiconductor memory cell, comprising:
a transistor having at least one diffused region, said transistor being adapted to be coupled to an associated bit line and an associated word line;
a storage capacitor having a bottom electrode and a top electrode, said top electrode being separated from said bottom electrode by a layer of ferroelectric material disposed therebetween, and said top electrode being adapted to be coupled to a plate line; and
an insulative layer disposed between said diffused region and said bottom electrode, said insulative layer separating said diffused region from said bottom electrode;
wherein said insulative layer is adapted to provide an ohmic contact between said diffused region and said bottom electrode in response to a preselected voltage being delivered across said insulative layer.

12. A semiconductor memory cell, comprising:
an access transistor having a drain, a source and a gate, said drain being adapted to be coupled to an associated bit line and said gate being adapted to be coupled to an associated word line;
a ferroelectric storage capacitor having a conductive bottom plate and a conductive top plate, said top plate being spaced a first preselected distance from said bottom plate and being connected to said bottom plate by a layer of ferroelectric material disposed therebetween, said top plate being adapted to be coupled to a plate line and said bottom plate being spaced from said source by a second preselected distance; and
a layer of insulative material being disposed between said source and said bottom plate and connecting said source to said bottom plate.

13. The memory cell, as set forth in claim 12, wherein said insulative material has a first predetermined breakdown voltage, and said ferroelectric material has a second preselected breakdown voltage, said second preselected breakdown voltage being greater than said first preselected breakdown voltage.

14. The memory cell, as set forth in claim 13, wherein said layer of insulative material is adapted for breaking down and substantially electrically connecting said bottom plate to said source in response to an application of a voltage having a magnitude greater than said first preselected breakdown voltage and less than said second preselected breakdown voltage between said source and said top plate.

15. The memory cell, as set forth in claim 12, wherein said insulative layer has a first preselected thickness, and said layer of ferroelectric material has a second preselected thickness, said second preselected thickness being greater than said first preselected thickness.

16. The memory cell, as set forth in claim 15, wherein said first preselected thickness corresponds to a first preselected breakdown voltage and said second preselected thickness corresponds to a second preselected breakdown voltage, said second preselected breakdown voltage being greater than said first preselected breakdown voltage.

17. The memory cell, as set forth in claim 15, wherein said second preselected thickness is about an order of magnitude thicker than said first preselected thickness.

18. The memory cell, as set forth in claim 17, wherein said first preselected thickness is about 100 angstroms and said second preselected thickness is about 2000 angstroms.

19. The memory cell, as set forth in claim 12, wherein said insulative material has a first dielectric constant, and said ferroelectric material has a second dielectric constant, said second dielectric constant being greater than said first dielectric constant.

20. The memory cell, as set forth in claim 19, wherein said second dielectric constant is at least two orders of magnitude greater than said first dielectric constant.

21. The memory cell, as set forth in claim 20, wherein said first dielectric constant is about 4 and said second dielectric constant is about 1000.

22. The memory cell, as set forth in claim 12, wherein said ferroelectric material is selected from a group consisting of lead zirconate titanate, lanthanum-doped lead zirconate titanate, or lithium niobate.

23. A semiconductor memory cell, comprising:
an access transistor having a drain, a source and a gate, said drain being adapted to be coupled to an associated bit line and said gate being adapted to be coupled to an associated word line;
a ferroelectric storage capacitor having a conductive bottom plate and a conductive top plate, said top plate being spaced a first preselected distance from said bottom plate and being connected to said bottom plate by a layer of ferroelectric material disposed therebetween, said top plate being adapted to be coupled to a plate line and said bottom plate being spaced from said source by a second preselected distance; and
a layer of insulative material being disposed between said source and said bottom plate and connecting said source to said bottom plate;
wherein said insulative layer is adapted to provide an ohmic contact between said source and said bottom plate in response to a preselected voltage being delivered across said insulative layer.

24. A semiconductor memory cell, comprising:
a MOSFET access transistor having a drain, a source, and a gate, said drain being connected to an associated bit line and said gate being connected to an associated word line;
a ferroelectric storage capacitor having a conductive top plate having a top and bottom surface, the top surface of said top plate being connected to a plate line, and a conductive bottom plate having a top and bottom surface, the bottom surface of said top plate being spaced a first preselected distance from the top surface of said bottom plate and the bottom surface of said bottom plate overlying said source, a layer of ferroelectric material disposed between the bottom surface of said top plate and the top surface of said bottom plate, said ferroelectric layer having a thickness substantially equal to said first preselected distance; and
an insulative layer being disposed between said source and the bottom surface of said bottom plate and ohmically connecting said source to the bottom surface of said bottom plate by breakdown, the relative thicknesses of said ferroelectric layer and of said insulative layer being selected to provide breakdown of only said insulative layer in response to a voltage having a predetermined magnitude applied between said plate line and said bit line.

25. A semiconductor memory cell, comprising:
a transistor having at least one region formed in a face of a semiconductor body, said transistor being adapted to be coupled to an associated bit line and an associated word line;

a polysilicon layer disposed on said face over said region;

a storage capacitor having a bottom electrode and a top electrode, said top electrode being separated from said bottom electrode by a layer of ferroelectric material disposed therebetween, and said top electrode being adapted to be coupled to a plate line; and an insulative layer disposed between said polysilicon layer and said bottom electrode, said insulative layer initially separating said polysilicon layer from said bottom electrode then breaking down to ohmically connect said polysilicon layer to said bottom electrode.

26. The memory cell, as set forth in claim 25, wherein said insulative layer has a first predetermined breakdown voltage, and said layer of ferroelectric material has a second preselected breakdown voltage, said second preselected breakdown voltage being greater than said first preselected breakdown voltage.

27. The memory cell, as set forth in claim 25, wherein said insulative layer has a first preselected thickness, and said layer of ferroelectric material has a second preselected thickness, said second preselected thickness being greater than said first preselected thickness.

28. The memory cell, as set forth in claim 27, wherein said first preselected thickness corresponds to a first preselected breakdown voltage and said second preselected thickness corresponds to a second preselected breakdown voltage, said second preselected breakdown voltage being greater than said first preselected breakdown voltage.

29. The memory cell, as set forth in claim 27, wherein said second preselected thickness is in the range of 5 to 50 times thicker than said first preselected thickness.

30. The memory cell, as set forth in claim 29, wherein said first preselected thickness is about 100 angstroms and said second preselected thickness is about 2000 angstroms.

31. The memory cell, as set forth in claim 25, wherein said insulative material has a first dielectric constant, and said ferroelectric material has a second dielectric constant, said second dielectric constant being greater than said first dielectric constant.

32. The memory cell, as set forth in claim 31, wherein said second dielectric constant is at least two orders of magnitude greater than said first dielectric constant.

33. The memory cell, as set forth in claim 32, wherein said first dielectric constant is about 4 and said second dielectric constant is about 1000.

34. The memory cell, as set forth in claim 25, wherein said ferroelectric material is selected from a group consisting of lead zircronate titanate, lanthanum-doped lead zircronate titanate, or lithium niobate.

35. A semiconductor memory cell, comprising:

a transistor having at least one diffused region, said transistor being adapted to be coupled to an associated bit line and an associated word line;

a polysilicon layer disposed on said diffused region;

a storage capacitor having a bottom electrode and a top electrode, said top electrode being separated from said bottom electrode by a layer of ferroelectric material disposed therebetween, and said top electrode being adapted to be coupled to a plate line; and an insulative layer disposed between said polysilicon layer and said bottom electrode, said insulative layer separating said polysilicon layer from said bottom electrode;

wherein said insulative layer is adapted to provide an ohmic contact between said polysilicon layer and said bottom electrode in response to a preselected voltage being delivered across said insulative layer.

36. A semiconductor memory cell, comprising:

an access transistor having a drain, a source and a gate, said drain being adapted to be coupled to an associated bit line and said gate being adapted to be coupled to an associated word line;

a polysilicon layer disposed on said source;

a ferroelectric storage capacitor having a conductive bottom plate and a conductive top plate, said top plate being spaced a first preselected distance from said bottom plate and a layer of ferroelectric material disposed between said top plate and said bottom plate, said top plate being adapted to be coupled to a plate line, and said bottom plate overlying said polysilicon layer; and a layer of insulative material being disposed between said polysilicon layer and said bottom plate and ohmically connecting said polysilicon layer to said bottom plate by breakdown.

37. The memory cell, as set forth in claim 36, wherein said insulative material has a first predetermined breakdown voltage, and said ferroelectric material has a second preselected breakdown voltage, said second preselected breakdown voltage being greater than said first preselected breakdown voltage.

38. The memory cell, as set forth in claim 37, wherein said layer of insulative material is adapted for breaking down and substantially electrically connecting said bottom plate to said polysilicon layer in response to an application of a voltage having a magnitude greater than said first preselected breakdown voltage and less than said second preselected breakdown voltage between said source and said top plate.

39. The memory cell, as set forth in claim 36, wherein said insulative layer has a first preselected thickness, and said layer of ferroelectric material has a second preselected thickness, said second preselected thickness being greater than said first preselected thickness.

40. The memory cell, as set forth in claim 39, wherein said first preselected thickness corresponds to a first preselected breakdown voltage and said second preselected thickness corresponds to a second preselected breakdown voltage, said second preselected breakdown voltage being greater than said first preselected breakdown voltage.

41. The memory cell, as set forth in claim 36, wherein said insulative material has a first dielectric constant, and said ferroelectric material has a second dielectric constant, said second dielectric constant being greater than said first dielectric constant.

42. The memory cell, as set forth in claim 41, wherein said second dielectric constant is at least two orders of magnitude greater than said first dielectric constant.

43. The memory cell, as set forth in claim 42, wherein said first dielectric constant is about 4 and said second dielectric constant is about 1000.

44. The memory cell, as set forth in claim 36, wherein said ferroelectric material is selected from a group consisting of lead zircronate titanate, lanthanum-doped lead zircronate titanate, or lithium niobate.

* * * * *